(12) United States Patent
Li

(10) Patent No.: US 10,097,791 B2
(45) Date of Patent: *Oct. 9, 2018

(54) RADIO FREQUENCY POWER DIVIDER NETWORKS HAVING MOCA BYPASS CIRCUITS AND RELATED METHODS

(71) Applicant: CommScope, Inc. of North Carolina, Hickory, NC (US)

(72) Inventor: Shi Man Li, Mooresville, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/640,151

(22) Filed: Jun. 30, 2017

(65) Prior Publication Data

US 2017/0302883 A1  Oct. 19, 2017

Related U.S. Application Data

(63) Continuation of application No. 14/672,260, filed on Mar. 30, 2015, now Pat. No. 9,743,038.

(60) Provisional application No. 61/973,970, filed on Apr. 2, 2014.

(51) Int. Cl.
  *H04N 7/16*   (2011.01)
  *H04N 7/173*  (2011.01)
  *H04N 7/10*   (2006.01)
  *H03H 7/46*   (2006.01)
  *H04N 21/61*  (2011.01)

(52) U.S. Cl.
  CPC ............. *H04N 7/104* (2013.01); *H03H 7/46* (2013.01); *H04N 21/6118* (2013.01)

(58) Field of Classification Search
  CPC ....... H04N 7/104; H04N 21/6118; H03H 7/46
  USPC ......................................................... 725/149
  See application file for complete search history.

(56) References Cited

U.S. PATENT DOCUMENTS

| 6,578,202 | B1 | 6/2003 | Holland |
| 8,286,209 | B2 | 10/2012 | Egan, Jr. et al. |
| 8,356,322 | B2 | 1/2013 | Wells et al. |
| 8,397,271 | B2 | 3/2013 | Riggsby |
| 2005/0289632 | A1 | 12/2005 | Brooks et al. |

(Continued)

*Primary Examiner* — Nasser M Goodarzi
*Assistant Examiner* — Jaycee Imperial
(74) *Attorney, Agent, or Firm* — Muncy, Geissler, Olds & Lowe, P.C.

(57) ABSTRACT

Power divider networks are provided that have Multimedia Over Coax Alliance ("MoCA") bypass paths. These power divider networks may include a housing having an input port and first and second output ports; a first impedance transformer that has a first winding coupled in series between the input port and a first node, a second winding coupled in series between a reference voltage and the first node; a second impedance transformer that has a third winding coupled in series between the first node and the first output port, a fourth winding coupled in series between the first node and the second output port; a resistance having a first end coupled to the first output port and a second end coupled to the second output port; a first inductor in series between the third winding and the first output port; a second inductor in series between the fourth winding and the second output port; and a third inductor and a first capacitor that are disposed in parallel between the first output port and the first end of the first resistance.

20 Claims, 14 Drawing Sheets

(56) References Cited

U.S. PATENT DOCUMENTS

| | | |
|---|---|---|
| 2010/0125877 A1 | 5/2010 | Wells et al. |
| 2010/0146564 A1 | 6/2010 | Halik et al. |
| 2010/0162340 A1* | 6/2010 | Riggsby .............. H04B 3/04 725/127 |
| 2010/0190357 A1 | 7/2010 | Hashim |
| 2011/0181371 A1 | 7/2011 | Alkan |
| 2013/0002958 A1 | 1/2013 | Labro |
| 2013/0181789 A1 | 7/2013 | Rijssemus |

* cited by examiner

RADIO FREQUENCY POWER DIVIDER NETWORKS HAVING MOCA BYPASS CIRCUITS AND RELATED METHODS

CROSS-REFERENCE TO RELATED APPLICATIONS

This application is a continuation of U.S. application Ser. No. 14/672,260, filed Mar. 30, 2015, which claims the benefit of U.S. Provisional Patent Application No. 61/973,970, filed Apr. 2, 2014, the entire contents of the two previous applications are herein incorporated by reference.

FIELD OF THE INVENTION

The present invention generally relates to radio frequency ("RF") power divider networks and, more particularly, to RF power divider networks that support Multimedia Over Coax Alliance ("MoCA") communications.

BACKGROUND

Cable television ("CATV") networks are a known type of communications network that are used to transmit information between a service provider and a plurality of subscriber premises, typically over fiber optic and/or coaxial cables. The service provider may offer, among other things, cable television, broadband Internet and Voice-over-Internet Protocol ("VoIP") digital telephone service to subscribers within a particular geographic area. The service provider transmits "forward path" or "downstream" signals from the headend facilities of the cable television network to the subscriber premises. "Reverse path" or "upstream" signals may also be transmitted from the individual subscriber premises back to the headend facilities. In the United States, the forward path signals are typically transmitted in the 54-1002 MHz frequency band, and may include, for example, different tiers of cable television channels, movies on demand, digital telephone and/or Internet service, and other broadcast or point-to-point offerings. The reverse path signals are typically transmitted in the 5-42 MHz frequency band and may include, for example, signals associated with digital telephone and/or Internet service and ordering commands (i.e., for movies-on-demand and other services).

Each subscriber premise typically includes one or more power divider networks (which may also be referred to herein as "power dividers") that are used to divide the downstream signals received from the service provider so that the downstream signal may be fed to a plurality of service ports such as wall outlets that are dispersed throughout the subscriber premise. These power divider networks also combine upstream signals that may be transmitted from one or more of the service ports into a composite upstream signal that is transmitted over the CATV network back to the headend facilities. Televisions, internet modems, set top boxes and the like may be connected to the respective wall outlets.

A recent trend is to use the coaxial cables that are installed throughout most homes, apartments and other subscriber premises as a network that may be used to transmit signals from a first end device that is connected to a first wall outlet in a subscriber premise to other end devices that are connected to other wall outlets in the subscriber premise. An industry alliance known as the Multi-media Over Coax Alliance ("MoCA") has developed standards which specify frequency bands, interfaces and other parameters that will allow equipment from different standards-compliant vendors to be used to distribute multi-media content over in-premise coaxial cable networks. These standards specify that such "MoCA" content is transmitted over the in-premise coaxial cable networks in the 850 MHz to 1675 MHz frequency band, although many service providers only distribute MoCA content within a narrower frequency band that is above the cable television band, such as, for example, the 1150 MHz to 1550 MHz frequency band. Thus, the MoCA content is transmitted over the in-premise network in a pre-selected MoCA frequency band. The power divider network in the in-premise network may be designed to support communications between its output ports in this pre-selected MoCA frequency band.

Examples of MoCA content that may be distributed over an in-premise coaxial cable network are digital television, video-on-demand programming and digitally-recorded television or music programming. In an exemplary application, such programming may be transmitted via the coaxial cables that run through the walls of a home from a primary set-top box (which may be a full service set top box having a digital television receiver, DVR and/or video-on-demand capabilities, etc.) to less capable, less expensive auxiliary set-top boxes that are installed on other televisions throughout the premises. In this manner, the full capabilities of the primary set top box may be enjoyed at all of the televisions within the residence without having to provide a primary set top box for each television.

A number of MoCA-enabled devices have been proposed which facilitate transmitting signals between wall outlets in a subscriber premise. These devices include (1) signal amplifiers that have power divider networks that are configured to facilitate MoCA communications and (2) MoCA power divider networks. Examples of such MoCA devices are disclosed in U.S. Pat. No. 8,397,271, U.S. Pat. No. 8,286,209, U.S. Patent Publication No. 2010/0125877, U.S. Patent Publication No. 2010/0146564 and U.S. Pat. No. 8,356,322.

SUMMARY

Pursuant to embodiments of the present invention, directional couplers having a Multimedia Over Coax Alliance ("MoCA") bypass path are provided. These directional couplers include: a housing having an input port, a first output port and a second output port; a first impedance transformer that has a first winding coupled in series between the input port and a first node and a second winding that is positioned to couple with the first winding, the second winding coupled in series between a reference voltage and the first node; a second impedance transformer that has a third winding coupled in series between the first node and the first output port and a fourth winding that is positioned to couple with the third winding, the fourth winding coupled in series between the first node and the second output port; a resistance having a first end coupled to the first output port and a second end coupled to the second output port; a first inductor in series between the third winding and the first output port; a second inductor in series between the fourth winding and the second output port; and a third inductor and a first capacitor that are disposed in parallel between the first output port and the first end of the first resistance.

In some embodiments, the resistance may have a value that is approximately twice the value of a desired impedance of the first output port. At least one of the first inductor or the second inductor may be implemented as traces on a printed circuit board that include one or more self-coupling sections. The third inductor may have an inductance between about 3 nH and about 12 nH and the first capacitor may have a capacitance between about 0.5 pF and about 3.0 pF. In some embodiments, the first and second inductors each have an inductance between about 3 nH and about 8 nH.

Pursuant to further embodiments of the present invention, radio frequency ("RF") power divider networks are provided that include first through third directional couplers. The first directional coupler has a first RF input port, a first signal splitting circuit, first and second RF output ports, a first inductor coupled in series between a first output of the first signal splitting circuit and the first RF output port and a second inductor coupled in series between a second output of the first signal splitting circuit and the second RF output port. The second directional coupler has a second RF input port that is coupled to the first RF output port, a second signal splitting circuit, third and fourth RF output ports, a third inductor coupled in series between a first output of the second signal splitting circuit and the third RF output port and a fourth inductor coupled in series between a second output of the second signal splitting circuit and the fourth RF output port. The third directional coupler has a third RF input port that is coupled to the second RF output port, a third signal splitting circuit, fifth and sixth RF output ports, a fifth inductor coupled in series between a first output of the third signal splitting circuit and the fifth RF output port and a sixth inductor coupled in series between a second output of the third signal splitting circuit and the sixth RF output port. The first directional coupler further includes a first resistor that has a first end and a second end that is coupled to the second RF output port, and a first capacitor and a seventh inductor that are coupled in parallel between the first RF output port and the first end of the first resistor.

In some embodiments, the first, second and seventh inductors, the first resistor and the first capacitor may comprise a first MoCA bypass circuit that is configured to pass signals in a MoCA frequency band between the first RF output port and the second RF output port, and the second directional coupler may include a second MoCA bypass circuit that consists essentially of the third inductor, the fourth inductor and a second resistor that is coupled between the third RF output port and the fourth RF output port.

In some embodiments, the third directional coupler may include a third MoCA bypass circuit that consists essentially of the fifth inductor, the sixth inductor and a third resistor that is coupled between the fifth RF output port and the sixth RF output port. The third MoCA bypass circuit may be substantially identical to the second MoCA bypass circuit.

In some embodiments, the RF power divider network may further include: a fourth directional coupler having a fourth RF input port, a fourth signal splitting circuit, seventh and eighth RF output ports, an eighth inductor coupled in series between a first output of the fourth signal splitting circuit and the seventh RF output port and a ninth inductor coupled in series between a second output of the fourth signal splitting circuit and the eighth RF output port; a fifth directional coupler having a fifth RF input port that is coupled to the seventh RF output port, a fifth signal splitting circuit, ninth and tenth RF output ports, a tenth inductor coupled in series between a first output of the fifth signal splitting circuit and the ninth RF output port and an eleventh inductor coupled in series between a second output of the fifth signal splitting circuit and the tenth RF output port; a sixth directional coupler having a sixth RF input port that is coupled to the tenth RF output port, a sixth signal splitting circuit, eleventh and twelfth RF output ports, a twelfth inductor coupled in series between a first output of the sixth signal splitting circuit and the eleventh RF output port and a thirteenth inductor coupled in series between a second output of the sixth signal splitting circuit and the twelfth RF output port; and a seventh directional coupler having a seventh RF input port, a seventh signal splitting circuit, thirteenth and fourteenth RF output ports, a fourteenth inductor coupled in series between a first output of the seventh signal splitting circuit and the thirteenth RF output port and a fifteenth inductor coupled in series between a second output of the seventh signal splitting circuit and the fourteenth RF output port. In such embodiments, the second directional coupler may further include a second resistor that has a first end and a second end that is coupled to the fourth RF output port, and a second capacitor and a sixteenth inductor that are coupled in parallel between the third RF output port and the first end of the second resistor. The third directional coupler may further include a third resistor that has a first end and a second end that is coupled to the sixth RF output port, and a third capacitor and a seventeenth inductor that are coupled in parallel between the fifth RF output port and the first end of the third resistor. The fourth directional coupler may include a first MoCA bypass circuit that consists essentially of the eight inductor, the ninth inductor and a fourth resistor that is coupled between the seventh RF output port and the eighth RF output port. The fifth directional coupler may include a second MoCA bypass circuit that consists essentially of the tenth inductor, the eleventh inductor and a fifth resistor that is coupled between the ninth RF output port and the tenth RF output port. The sixth directional coupler may include a third MoCA bypass circuit that consists essentially of the twelfth inductor, the thirteenth inductor and a sixth resistor that is coupled between the eleventh RF output port and the twelfth RF output port. The seventh directional coupler may include a fourth MoCA bypass circuit that consists essentially of the fourteenth inductor, the fifteenth inductor and a seventh resistor that is coupled between the thirteenth RF output port and the fourteenth RF output port.

In some embodiments, the first resistor may have a value of approximately 150 ohms. The first through sixth inductors may each be implemented as traces on a printed circuit board that include one or more self-coupling sections.

Pursuant to further embodiments of the present invention, radio frequency ("RF") power divider networks are provided that include: a first directional coupler having a first RF input port, a first signal splitting circuit, first and second RF output ports and a first MoCA bypass circuit that is configured to pass signals in a MoCA frequency band between the first RF output port and the second RF output port; a second directional coupler having a second RF input port that is coupled to the first RF output port, a second signal splitting circuit, third and fourth RF output ports and a second MoCA bypass circuit that is configured to pass signals in the MoCA frequency band between the third RF output port and the fourth RF output port; and a third directional coupler having a third RF input port that is coupled to the second RF output port, a third signal splitting circuit, fifth and sixth RF output ports and a third MoCA bypass circuit that is configured to pass signals in the MoCA frequency band between the fifth RF output port and the sixth RF output port. In these RF power divider networks, the first MoCA bypass circuit is different from the second MoCA bypass circuit and the third MoCA bypass circuit.

In some embodiments, the first MoCA bypass circuit may include at least one inductor and at least one capacitor that are not included in the second MoCA bypass circuit or the third MoCA bypass circuit.

In some embodiments, at least some of the circuit elements in the second MoCA bypass circuit may be configured to reduce the maximum signal loss in the first MoCA bypass circuit. The circuit elements in the second MoCA bypass circuit and the third MoCA bypass circuit may combine with the circuit elements in the first MoCA bypass circuit to form a multi-pole filter that exhibits a reduced maximum signal loss in the MoCA frequency band for signals passing from the first output port to the second output port as compared to an identical RF power divider network with the second and third MoCA bypass circuits omitted therefrom.

Pursuant to still further embodiments of the present invention, methods of designing a radio frequency ("RF") power divider network formed from cascaded levels of directional couplers are provided, where the power divider network includes at least a first level that has a first directional coupler and a second level that includes second and third directional couplers that have inputs that are coupled to the respective first and second outputs of the first directional coupler. Pursuant to these methods, the values of circuit elements in a second high frequency bypass path that is provided between the output ports of the second directional coupler are selected to improve the performance of a first high frequency bypass path that is provided between the output ports of the first directional coupler by reducing the maximum signal loss in a high frequency band that the first high frequency bypass path is configured to pass.

DETAILED DESCRIPTION

Pursuant to embodiments of the present invention, RF power divider networks are provided that support MoCA communications. These RF power divider networks may include one or more directional couplers that may split a received input signal two-ways, four-way, eight-ways, etc. The directional couplers may include MoCA bypass paths between the output ports thereof that provide a lower loss transmission path for signals in the MoCA frequency band(s). The directional couplers may still maintain a high degree of isolation between the output ports thereof for signals in the CATV network frequency band.

While a number of power divider networks have been proposed that include MoCA bypass circuits, these bypass circuits tend to use relatively complex filtering that may increase the cost of the power divider network. Additionally, the filters that are used may degrade the impedance value of the output ports in the CATV frequency band from a desired value (e.g., 75 ohms), resulting in signal reflections, power losses and other performance degradations. Pursuant to embodiments of the present invention, directional couplers having MoCA bypass paths with simple filter structures are provided that may provide acceptable isolation levels in the CATV frequency band while still passing signals in the MoCA frequency band with acceptably low levels of attenuation. Power divider networks according to embodiments of the present invention that include two or more levels may use different MoCA bypass path designs at different levels that provide differing amounts of signal loss in the MoCA frequency bands. In some embodiments, the MoCA bypass circuits included in the directional couplers at different levels of the power divider networks may be designed to operate together akin to a multi-pole filter in order to provide lower loss MoCA transmissions when the MoCA transmission extends through multiple levels of the power divider network.

The power divider networks according to embodiments of the present invention may have very elegant designs and may be less expensive to manufacture than conventional MoCA-enabled power divider networks. Moreover, the power divider networks may not require provision of a reflective MoCA rejection filter at the input to the power divider network.

Power divider networks according to embodiments of the present invention are discussed in more detail below with reference to the attached drawings, in which example embodiments of these power divider networks are shown. Before describing these embodiments it is helpful to discuss the design of a known conventional directional coupler that may be used as a 2-way power divider network or which may be used as a building block in a 4-way or 8-way power divider network.

Figure 1:
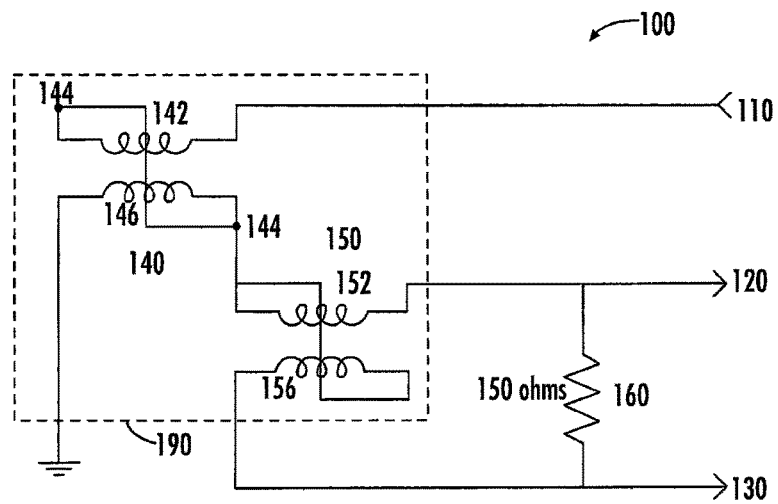
FIG. 1 is a circuit diagram of a conventional RF directional coupler that may be used as a 2-way power divider network.

FIG. 1 is a circuit diagram of a conventional RF directional coupler 100. As shown in FIG. 1, the directional coupler 100 has a bi-directional RF input port 110 and a pair of bi-directional RF output ports 120, 130. The RF input port 110 is configured to receive a composite forward path RF signal from a service provider, or any other appropriate signal source. End devices in the subscriber premise such as, for example, televisions, modems, telephones, may be connected to the output ports 120, 130. Due to the bi-directional nature of the ports 110, 120, 130, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

The directional coupler 100 includes a first impedance transformer 140, a second impedance transformer 150 and a resistor 160. The first impedance transformer 140 may comprise, for example, a torroid coil that is mounted on a printed circuit board. The impedance transformer 140 may include a first coil 142 that has a first end that is connected to the input port 110 and a second end that is connected to a node 144. The impedance transformer 140 further includes a second coil 146 that is intertwined with the first coil 142. The second coil 146 has a first end that is connected to node 144 and a second end that is connected to a reference voltage such a ground connection.

The second impedance transformer 150 may also comprise, for example, a torroid coil that is mounted on a printed circuit board. The impedance transformer 150 may include a first coil 152 that has a first end that is connected to the node 144 and a second end that is connected to the output port 120. The impedance transformer 150 further includes a second coil 156 that is intertwined with the first coil 152. The second coil 156 has a first end that is connected to the node 144 and a second end that is connected to the second output port 130. The first and second impedance transformers 140, 150 together comprise a signal splitting circuit 190 that splits the signal energy of a signal received at the RF input port 110 into two signals and deliver those signals to the respective output ports 120, 130.

A resistor 160 is coupled between the output ports 120, 130. The resistor 160 may have a value that is approximately twice a desired impedance of each of the output ports 120, 130. In typical CATV applications, this desired impedance is 75 ohms, so the resistor 160 may have a value of approximately 150 ohms. This value may vary, however, because couplings within the directional coupler 100 may impact the ideal resistance.

As is known to those of skill in the art, conventional directional couplers such as directional coupler 100 are typically designed to provide a high degree of isolation between their output ports such as, for example, at least 25 dB of isolation in the frequency band of the signals that are transmitted from the input port 110 to the output ports 120, 130. This isolation may help ensure, for example, that a signal transmitted in the reverse direction (i.e., from output port 120 to input port 110) does not interfere with data transmissions through the other output port 130. The high degree of isolation between the output ports 120, 130 also is important because one of the output ports of a directional coupler may be left un-terminated within a subscriber premise (i.e., the output port connects to a wall jack that does not have an end device connected thereto), and hence the high degree of isolation between the output ports may reduce the impact that the unmatched termination on the unterminated output port may have on signals flowing through the other output port of the directional coupler.

Figure 2:
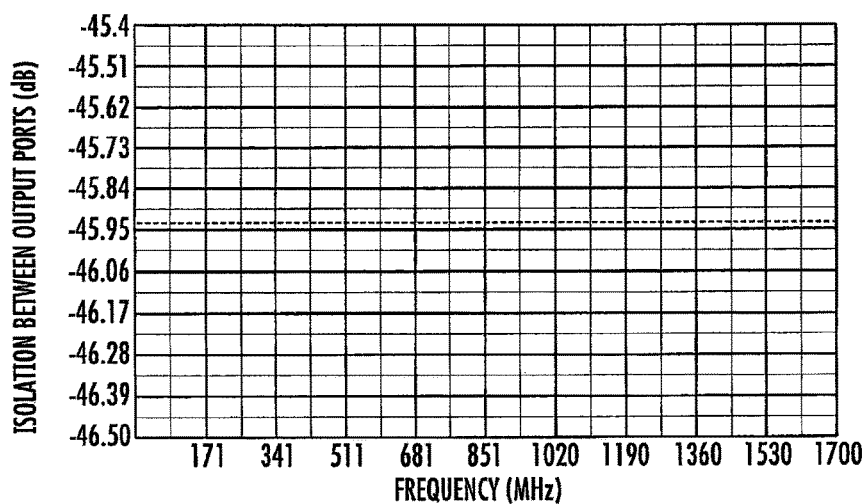
FIG. 2 is a graph illustrating the degree of isolation between the output ports of the RF directional coupler of FIG. 1 as a function of frequency.

FIG. 2 illustrates the expected isolation between the output ports of a conventional directional coupler (such as the directional coupler 100 of FIG. 1) as a function of frequency. As shown in FIG. 2, isolation of about 46 dB may be obtained between the two output ports across both the CATV frequency band and the MoCA frequency band (while FIG. 2 shows the isolation as being constant, it will be appreciated that typically there will be some degree of variation with frequency). This high degree of isolation, however, may significantly attenuate MoCA signals that are transmitted between the output ports. Thus while the high degree of isolation may provide excellent performance for CATV signals, it also may prevent the directional coupler from supporting MoCA communications because of the high level of isolation in the MoCA band.

As known to those of skill in the art, insertion loss refers to the loss in signal power from the insertion of a device along a transmission line, and is usually expressed in decibels as:

$$10 \log 10(P_T/P_R)$$

where $P_T$ is the power received at the load before insertion of the device and $P_R$ is the power received at the load after insertion of the device. For a splitter such as the directional coupler 100 of FIG. 1, the simulated insertion loss is 3 dB, and this value remains constant throughout both the CTAV and MoCA frequency bands. The loss of 3 dB occurs because the signal received at the input port is split in half between the two output ports. As the simulation assumes ideal transformers and transmission lines, the simulated insertion loss tracks the theoretical minimum insertion loss value of 3 dB. While real world devices will not in fact achieve insertion losses this low, the simulated insertion loss value for the directional coupler 100 is useful for comparison to simulated insertion loss values for directional couplers and power divider networks according to embodiments of the present invention.

It will be appreciated that a directional coupler such as directional coupler 100 may evenly split the signal energy received at the input port thereof and output this evenly split signal through the two output ports or, alternatively, may be designed to unevenly split the received input signal so that one of the output ports receives a greater percentage of the input signal than the other output port. Directional couplers that substantially evenly split an input signal may also be referred to as "splitters." Herein, the term "directional coupler" is used to encompass devices that both evenly and unevenly split the received input signal. The term "splitter" is used herein to refer to the subset of directional couplers that substantially equally split a received input signal.

Figure 3:
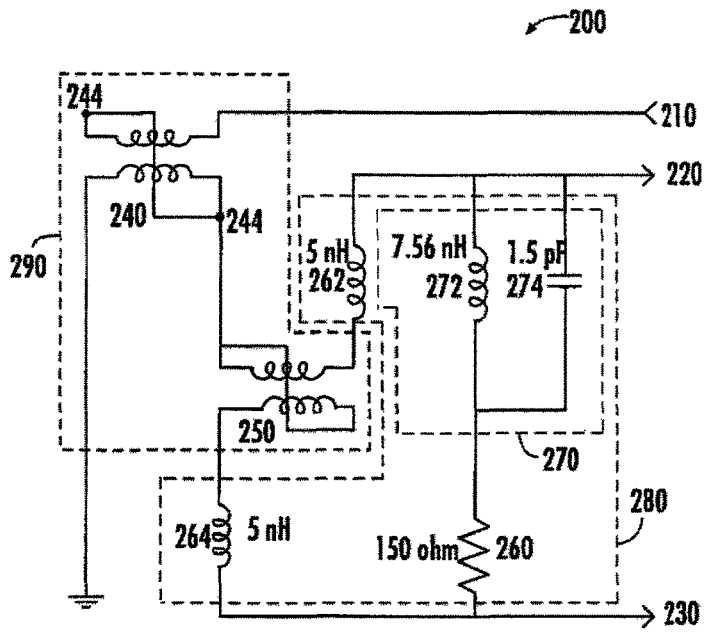
FIG. 3 is a circuit diagram of an RF directional coupler that includes a MoCA bypass path according to embodiments of the present invention.

FIG. 3 is a circuit diagram of an RF directional coupler 200 that includes a MoCA bypass path according to embodiments of the present invention. The directional coupler 200 may be utilized as a 2-way power divider network, as the directional coupler 200 is designed to receive an input signal and to split the power of the received input signal between two output ports. As shown in FIG. 3, the directional coupler 200 has a bi-directional RF input port 210, a pair of bi-directional RF output ports 220, 230, a first impedance transformer 240, a second impedance transformer 250 and a resistor 260 and a first node 244. These components may be identical to the RF input port 110, the RF output ports 120, 130, the impedance transformers 140, 150, the resistor 160 and the first node 144 of directional coupler 100, respectively, and may be arranged in the exact same configuration, and hence further discussion of these components will be omitted here. The first and second impedance transformers 240, 250 may act as a signal splitting circuit 290. The signal splitting circuit 290 has first and second outputs that are coupled to the respective first and second RF output ports 220, 230.

The directional coupler 200 further includes a first inductor 262 that is positioned in series between the second impedance transformer 250 and the first output port 220, and a second inductor 264 that is positioned in series between the second impedance transformer 250 and the second output port 230. The first inductor 262 is coupled in series between the first output of the signal splitting circuit 290 and the first RF output port 220, and the second inductor 264 is coupled in series between the second output of the signal splitting circuit 290 and the second RF output port 230. Additionally, a circuit 270 that includes a third inductor 272 that is in parallel with a capacitor 274 is provided in series between the first RF output port 220 and the resistor 260.

Figure 4A:
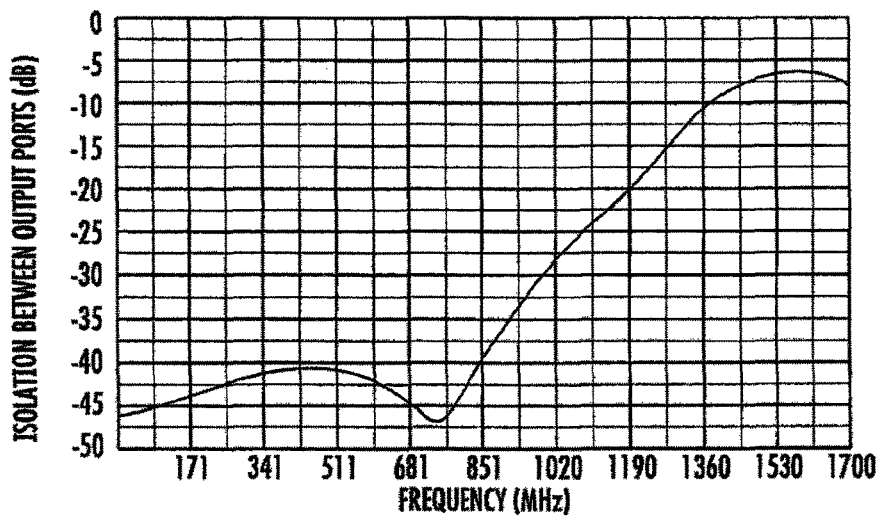
FIG. 4A is a graph illustrating the degree of isolation between the output ports of the RF directional coupler of FIG. 3 as a function of frequency.

These circuit components 260, 262, 264, 272, 274 may serve as a MoCA bypass circuit 280 that reduces the isolation between output port 220 and output port 230 in the MoCA frequency band. For example, FIG. 4A is a graph illustrating the degree of isolation between the output ports 220, 230 of the directional coupler 200 of FIG. 3 as a function of frequency. As shown in FIG. 4A, the MoCA bypass circuit 289 may act as a high pass filter that passes signals above approximately 1500 MHz with relatively low loss (e.g., less than 10 dB) while maintaining a high degree of isolation between output ports 220 and 230 throughout most of the CATV frequency band (e.g., isolation of greater than 40 dB for frequencies below about 750 MHz. The frequency response of the MoCA bypass circuit 280 has a moderate slope between 750 and 1500 MHz such that 28.8 dB of isolation is provided between output ports 220 and 230 at the top of the CATV band (i.e., at 1002 MHz) and isolation of 22.2 dB is provided at the lower end of the MoCA frequency band (i.e., at 1125 MHz). It has been found that these levels of isolation are sufficient for proper operation in both the CATV and MoCA frequency bands. In other words, even though reduced isolation is achieved at the highest frequencies in the CATV band, this reduced isolation does not materially impact device performance in the CATV band. Likewise, even though relatively high loss levels are experienced at the lowest frequencies of the MoCA band, these higher loss levels for a small range of frequencies do not materially degrade the performance of MoCA signals.

Figure 4B:
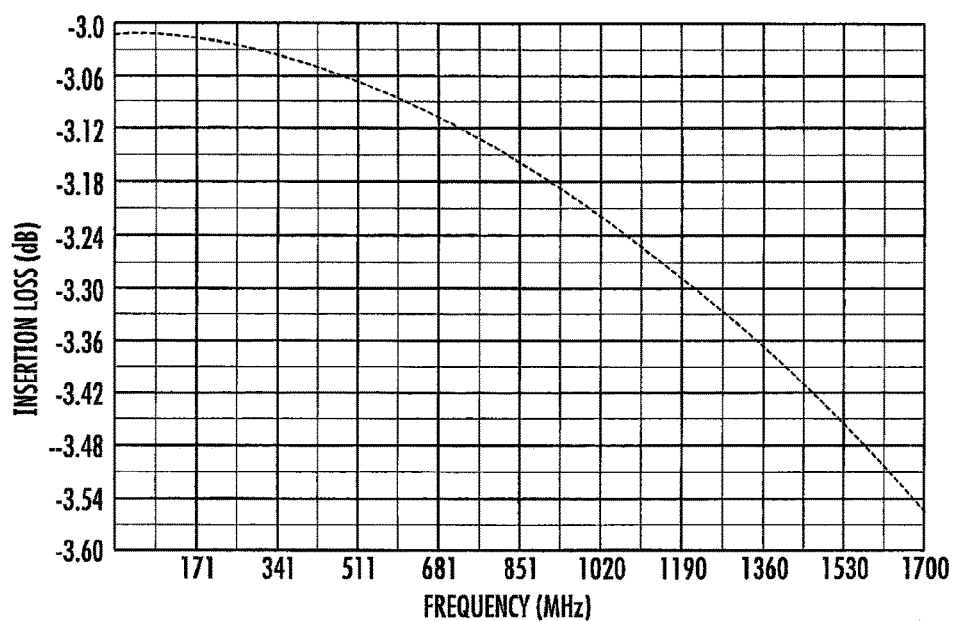
FIG. 4B is a graph illustrating the simulated insertion loss of the RF directional coupler of FIG. 3 as a function of frequency.

FIG. 4B is a graph illustrating the simulated insertion loss of the RF directional coupler 200 of FIG. 3 as a function of frequency. As shown in FIG. 4B, the simulated insertion loss is about 3 dB at very low frequencies, and increases with increasing frequency to a value of about 3.2 dB at the top of the CATV frequency band and to a value of just over 3.5 dB at the top of the MoCA frequency band. Thus, it can be seen that the MoCA bypass circuit 280 is expected to have only a very small impact on the insertion loss within the CATV frequency band (i.e., a maximum additional loss of about 0.2 dB and an average additional loss of about 0.1 dB). While the additional insertion loss values are higher in the MoCA frequency band, they still only reach a maximum value of about 0.5 dB.

Figure 5:
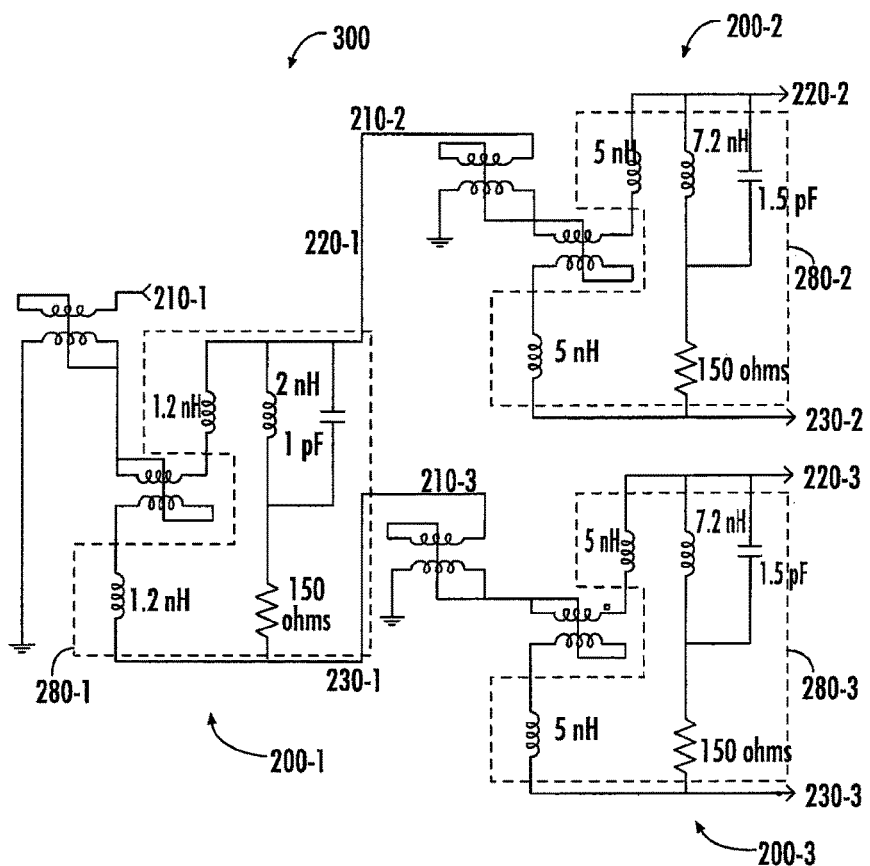
FIG. 5 is a schematic diagram of a 4-way RF power divider network according to embodiments of the present invention.

FIG. 5 is a schematic diagram of a 4-way RF power divider network 300 according to embodiments of the present invention. As shown in FIG. 5, the 4-way power divider network 300 is formed by cascading three of the directional couplers 200 of FIG. 3 in a "tree network" configuration where the base of the power divider network 300 includes a first of the directional couplers 200-1, and the input ports of two additional directional couplers 200-2, 200-3 are connected to the output ports of directional coupler 200-1. However, as can be seen in FIG. 5, the values of the components in the MoCA bypass circuit 280 of directional coupler 200-1 have been varied from the values shown in FIG. 3.

Before explaining one of the rationales for varying the component values in circuit 280 of directional coupler 200-1, it is helpful to discuss the various ways that a MoCA signal may traverse the power divider network 300 and the different signal loss values that a MoCA signal may experience depending upon its path through the power divider network 300.

In particular, a MoCA signal may enter the power divider network 300 through any of the output ports of directional couplers 200-2 and 200-3. These four output ports are labeled 220-2, 230-2, 220-3 and 230-3 in FIG. 5. If the MoCA signal is being transmitted from end devices that are connected to the output ports of the same directional coupler (e.g., between RF output ports 220-2 and 230-2 or between RF output ports 220-3 and 230-3), then the MoCA signal will only need to traverse one of the three directional couplers 200 in the power divider network 300. For example, if a MoCA signal is being transmitted from a first end device that is directly connected to output port 230-2 to a second end device that is directly connected to output port 220-2, the MoCA signal will only need to traverse the circuit 280-2 to arrive at the second end device. As shown in FIG. 4A, the amount of signal loss experienced by the MoCA signal will vary as a function of frequency between about −22 dB at 1150 MHz to about −6 dB at 1675 MHz., with an average signal loss in the MoCA band of about 13 dB.

In contrast, if the MoCA signal is transmitted from end devices that are connected to the output ports of different directional couplers, then the MoCA signal will need to traverse all three of the directional couplers 200 in the power divider network 300. For example, if a MoCA signal is being transmitted from a first end device that is directly connected to output port 230-2 to a second end device that is directly connected to output port 230-3, the MoCA signal will need to travel from the output port 230-2 to the input port 210-2 of directional coupler 200-2, then through the MoCA bypass circuit 280-1 of directional coupler 200-1, then from the input port 210-3 of directional coupler 200-3 to the output port 230-3.

As is known to those of skill in the art, a signal traversing a splitter in either the forward or reverse directions will typically experience a loss of about 3.5 to 4 dB as the splitter is designed to split the signal energy in half (resulting in a 3 dB loss) and additional losses of 0.5-1.0 dB are typical for signals in the CATV and MoCA frequency bands. Thus, a MoCA signal that is transmitted from, for example, output port 230-2 to output port 230-3 will experience about a 4 dB loss passing through directional coupler 200-2, about an average loss of 13 dB traversing the MoCA bypass path 280-1 of directional coupler 200-1, and a loss of about 4 dB passing through directional coupler 200-3. Thus, under this scenario, the MoCA signal will experience an average loss of about 21 dB, which is 8 dB more than the case when the two end devices are connected to the output ports of the same directional coupler. As the level of loss increases, it may become more difficult to guarantee that the MoCA signals can be transmitted throughout the subscriber premise with an acceptable level of signal quality. Moreover, if larger power divider networks (e.g., 8-way, a combination of an 8-way and a 4-way, 16-way, etc.) are used, the magnitude of the losses on some signal paths increases accordingly.

Pursuant to embodiments of the present invention, it has been discovered that in power divider networks that have a plurality of directional couplers that are cascaded to form a tree network, the component values used in the MoCA bypass circuits of the directional couplers at different levels of the tree network may have different values to provide improved performance. In effect, the MoCA bypass circuits may act akin to a multi-pole filter that may provide improved performance as compared to the filter implemented in any single one of the directional couplers. Thus, for MoCA signals that must traverse multiple levels of the power divider network, improved filtering may be achieved such that sufficient isolation is maintained between the end devices with respect to the CATV band while reduced losses may be experienced by signals in the MoCA frequency band that traverse the MoCA bypass circuits of the directional couplers. As the signals that must traverse multiple levels of the power divider network are the signals that generally experience the highest loss levels, the power divider networks according to embodiments of the present invention may provide improved overall performance. This multi-pole filtering effect may improve the performance of the MoCA bypass circuits 280 that are provided at some or all levels of the power divider network.

Figure 6A:
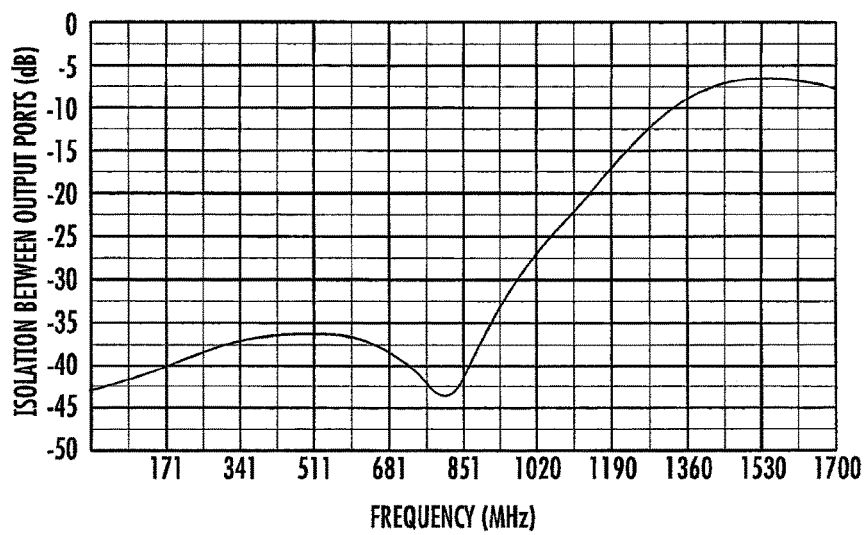
FIG. 6A is a graph illustrating the degree of isolation between two output ports of the 4-way power divider network of FIG. 5 that are part of the same directional coupler.

For example, FIG. 6A is a graph illustrating the simulated degree of isolation between the two output ports 220-2, 230-2 of directional coupler 200-2 of the 4-way power divider 300 of FIG. 5. As shown in FIG. 6A, the multi-pole filtering effects provide improved performance as compared to the performance of the identical directional coupler 200 implemented as a stand-alone 2-way power divider network (which is shown in FIG. 4A). In particular, as shown in FIG. 6A, the isolation in the CATV band exceeds 28 dB at all frequencies, and is only about three quarters of a dB worse than the performance of the stand-alone device as is shown in FIG. 4A. In the MoCA frequency band, the maximum loss is reduced to 20.37 dB, as compared to a loss of 22.24 dB in the stand alone device (see FIG. 4A) for a performance improvement of almost 2 dB.

Figure 6B:
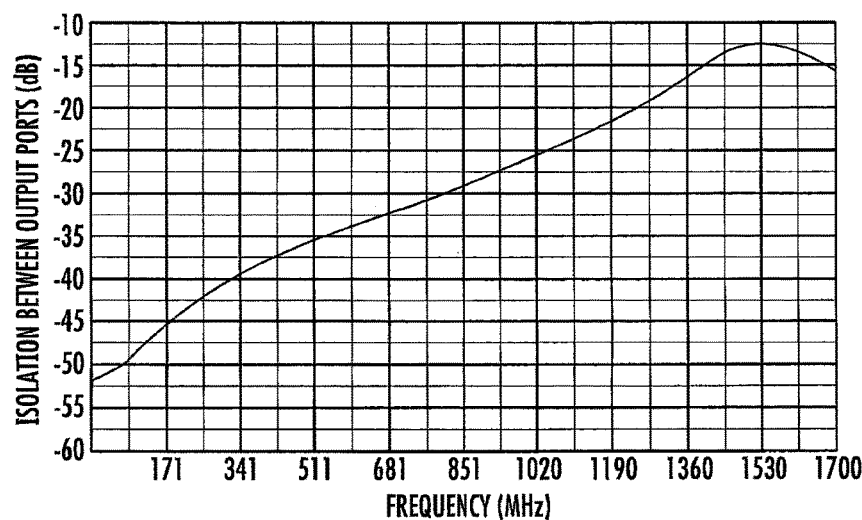
FIG. 6B is a graph illustrating the degree of isolation between two output ports of the 4-way power divider network of FIG. 5 that are part of different directional couplers.

The improvement is more dramatic for signals that pass through multiple levels of the power divider network 300. In particular, FIG. 6B is a graph illustrating the simulated degree of isolation between output port 220-2 and output port 230-3 of the 4-way power divider network 300 of FIG. 5. As shown in FIG. 6B, while the performance degrades somewhat as compared to the performance illustrated in FIGS. 3 and 5, more than 26 dB of isolation is maintained throughout the entire CATV frequency band, and the worst case loss in the MoCA frequency band is 23.28 dB, which is only about 1 dB worse than the 2-way power divider network 200, even though the MoCA signal must pass through two additional directional couplers (for which the expected loss would be about 8 dB). Thus, FIGS. 6A and 6B show that the techniques according to embodiments of the present invention may provide significantly improved performance in the MoCA frequency band while still providing acceptable levels of isolation in the CATV frequency band.

Figure 7:
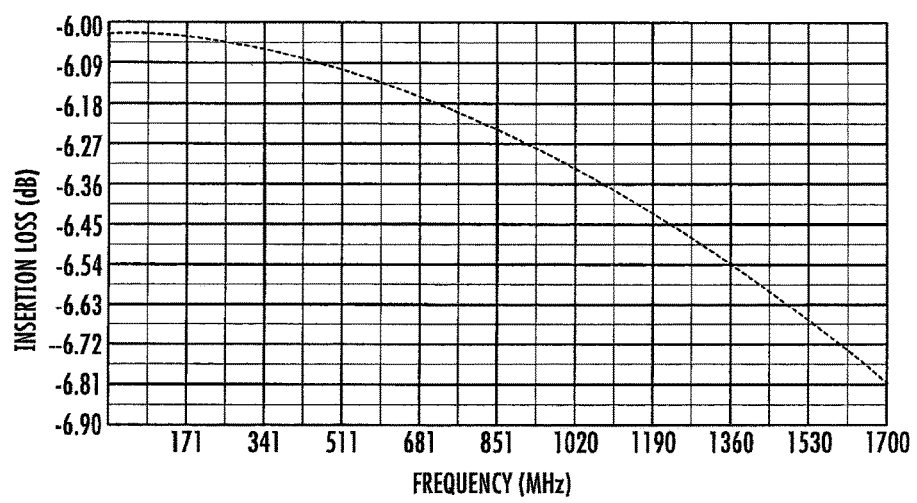
FIG. 7 is a graph illustrating the simulated insertion loss of the 4-way power divider network of FIG. 5 as a function of frequency.

FIG. 7 is a graph illustrating the simulated insertion loss of the 4-way power divider 300 of FIG. 5 as a function of frequency. As shown in FIG. 7, the simulated insertion loss is about 6 dB at very low frequencies, and increases with increasing frequency to a value of about 6.3 dB at the top of the CATV frequency band and to a value of about 6.75 dB at the top of the MoCA frequency band. As the input signal traverses two directional couplers in the 4-way power divider network 300, the theoretical minimum insertion loss for this device is 6 dB. As shown in FIG. 7, the maximum simulated insertion loss in the CATV band is about 6.3 dB, which indicates that the MoCA bypass circuit is only expected to result in an additional 0.3 dB of loss (or less at lower frequencies) in the CATV band. While the MoCA bypass circuit results in increased insertion loss in the MoCA frequency band, the simulated insertion loss still only reaches a maximum value of about 0.75 dB.

Figure 8:
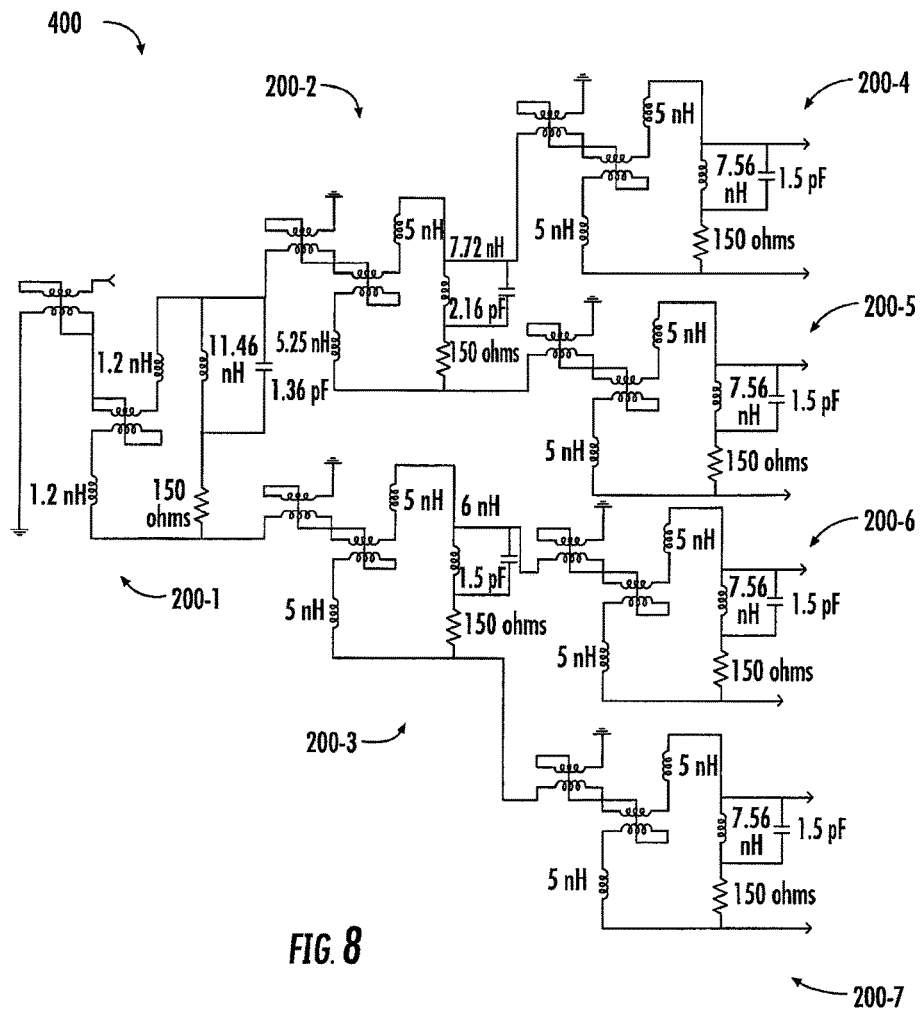
FIG. 8 is a schematic diagram of an 8-way RF power divider network according to embodiments of the present invention.

FIG. 8 is a schematic diagram of an 8-way RF power divider network 400 according to further embodiments of the present invention. As shown in FIG. 8, the 8-way power divider network 400 is formed by cascading seven of the directional couplers 200 of FIG. 3 in a tree network configuration, where four additional direction couplers are connected to the four respective output ports of the directional couplers 200-2 and 200-3 of the 4-way power divider network 300 of FIG. 5. As can be seen in FIG. 8, the values of various of the components in the MoCA bypass circuits 280-1, 280-2 and 280-3 of directional couplers 200-1 through 200-3 have been varied from the values shown in FIG. 3 in order to provide the multi-pole filtering effects discussed above. Directional couplers 200-4 through 200-7 may be identical to directional coupler 200 of FIG. 3 (and may have identical component values in the MoCA bypass circuit 280 thereof).

Figure 9A:
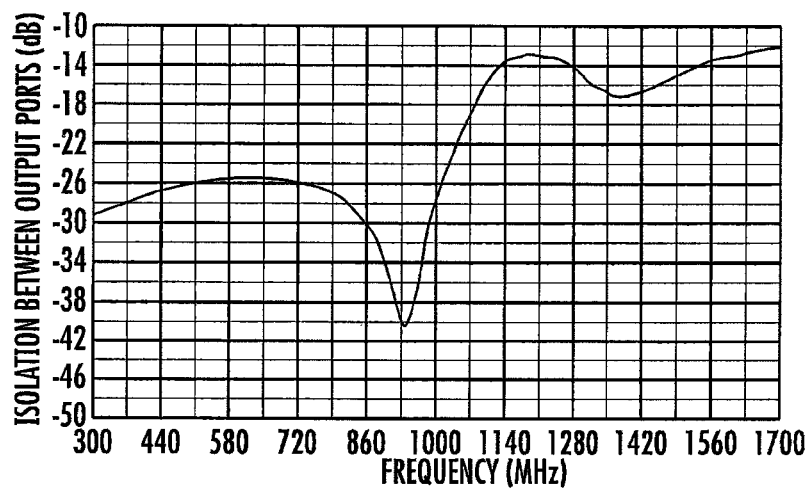
FIG. 9A is a graph illustrating the degree of isolation between two output ports of the 8-way power divider network of FIG. 8 that are part of the same directional coupler.

FIG. 9A is a graph illustrating the degree of isolation between two output ports (e.g., the two output ports of directional coupler 200-5) of the 8-way RF power divider network 400 of FIG. 8 that are part of the same directional coupler. As shown in FIG. 9A, the multi-pole filtering effects result in a significantly different frequency response as compared to the frequency response shown in FIG. 4A for the directional coupler 200 utilized as a stand-alone 2-way power divider network. In particular, as shown in FIG. 9A, the isolation in the CATV band has a minimum value of about 25 dB which occurs in the middle of the CATV frequency band, and generally displays less isolation at almost all frequencies as compared to the frequency response shown in FIG. 4A. However, since CATV network operators may only care about the worst case performance, the reduction in the worst-case isolation is less than 3 dB, which may be acceptable. Moreover, with respect to the MoCA frequency band, it can be seen that a significant reduction in signal loss is achieved, with a maximum signal loss of about 17 dB in the MoCA frequency band, which is greater than a 5 dB improvement over the stand-alone 2-way power divider network 200 of FIG. 3.

Figure 9B:
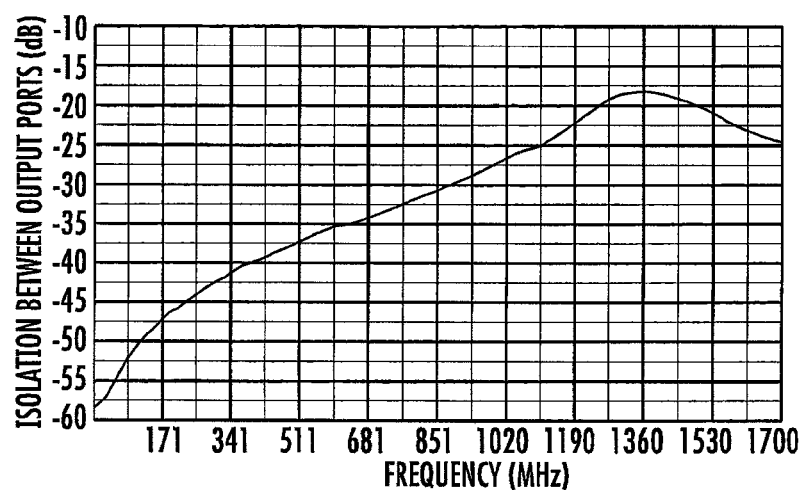
FIG. 9B is a graph illustrating the degree of isolation between two output ports of the 8-way power divider network of FIG. 8 that are part of directional couplers that are on opposite sides of the power divider network.

Generally improved performance may also be achieved for MoCA signals that must traverse all three levels of the 8-way power divider network 400. In particular, FIG. 9B is a graph illustrating the simulated degree of isolation between one of the output ports of directional coupler 200-4 and one of the output ports of directional coupler 200-7 of the 8-way power divider 400 of FIG. 8. As shown in FIG. 9B, more than 27 dB of isolation is maintained throughout the entire CATV frequency band, which is similar to the degree of isolation shown in FIG. 3 for the stand-alone directional coupler 200. Moreover, in the MoCA frequency band the maximum loss is 24 dB, which is less than 2 dB worse than the performance of the stand-alone 2-way power divider 200, even though the MoCA signal in the case of FIG. 9B traverses all three levels of the power divider network 400 and hence must pass through a total of five directional couplers 200.

Figure 10A:
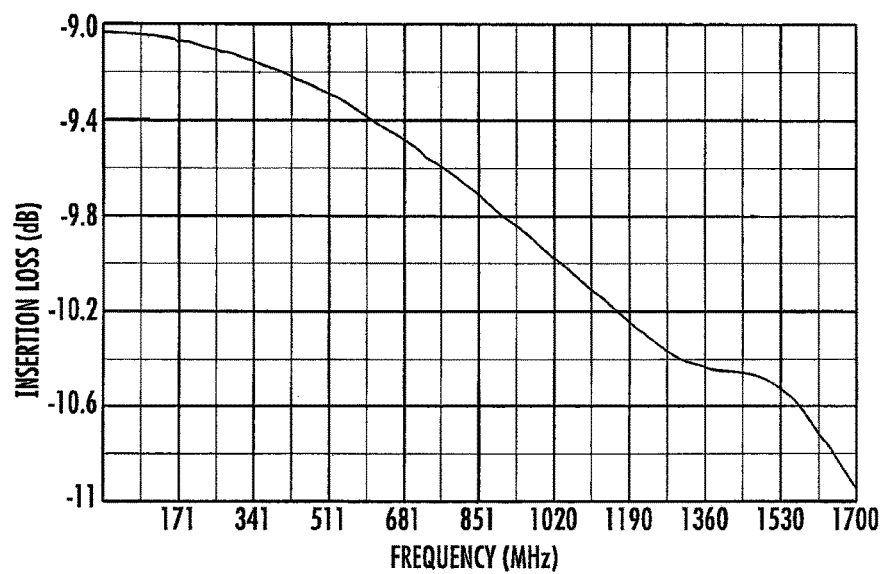
FIG. 10A is a graph illustrating the simulated insertion loss of the 8-way power divider network of FIG. 8 as a function of frequency.

FIG. 10A is a graph illustrating the simulated insertion loss of the 8-way power divider 400 of FIG. 8 as a function of frequency. As shown in FIG. 10A, the simulated insertion loss is about 9 dB at very low frequencies, and increases with increasing frequency to a value of about 9.9 dB at the top of the CATV frequency band and to a value of about 10.7 dB at the top of the MoCA frequency band. As the input signal traverses three directional couplers in the 8-way power divider network 400, the theoretical minimum insertion loss for this device is 9 dB. As shown in FIG. 10A, the maximum simulated insertion loss in the CATV band is less than 1 dB more than the theoretical minimum value. While the MoCA bypass circuit results in increased insertion loss in the MoCA frequency band, the simulated insertion loss still only reaches a maximum value of about 1.7 dB above the theoretical minimum value.

Figure 10B:
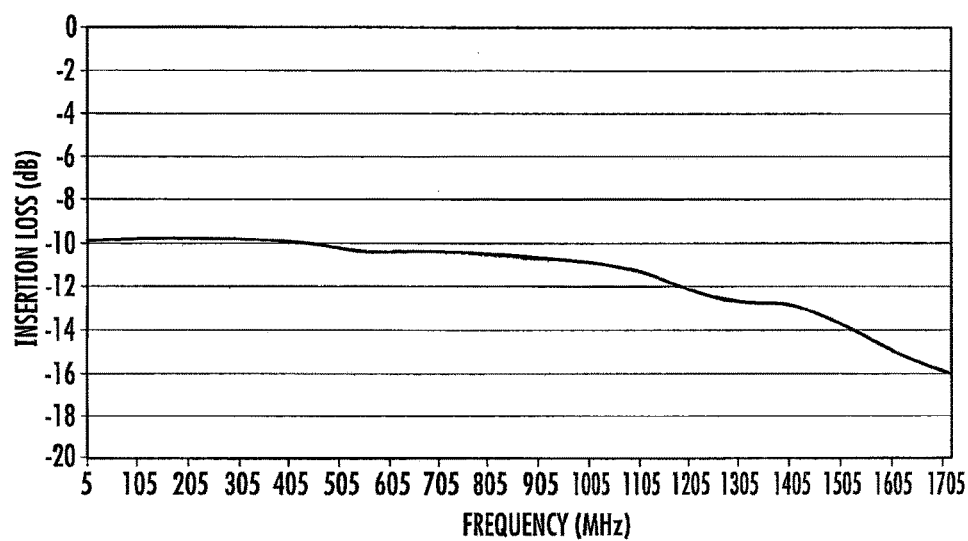
FIG. 10B is a graph illustrating the measured insertion loss as a function of frequency for an actual embodiment of the 8-way power divider of FIG. 8.

FIG. 10B is a graph illustrating the measured insertion loss as a function of frequency for an actual embodiment of the 8-way power divider 400 of FIG. 8. As shown in FIG. 10B, the measured insertion loss is about 10 dB at frequencies up to about 700 MHz and then drops, with increasing rate, to about 16 dB at the top of the MoCA frequency band. This shows that throughout the CATV frequency band performance may be achieved that is very close to the ideal simulated performance, but some degradation in performance may be expected, particularly in the upper portion of the MoCA frequency band.

Pursuant to further embodiments of the present invention, it has been discovered that acceptable performance may also be obtained using simpler MoCA bypass circuits in the higher levels of a multi-level power divider network. Embodiments of the present invention which take this approach will now be discussed with reference to FIGS. 11-14.

Figure 11A:
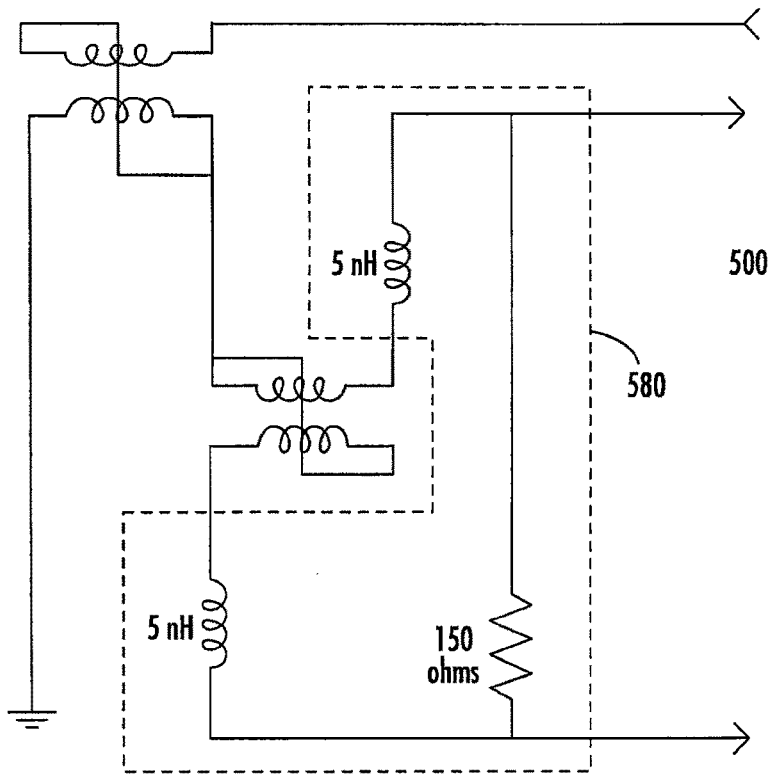
FIG. 11A is a circuit diagram of an RF directional coupler that includes a simplified MoCA bypass path.

In particular, FIG. 11A is a circuit diagram of an RF directional coupler 500 that includes a simplified MoCA bypass path according to embodiments of the present invention. As shown in FIG. 11A, the directional coupler 500 is identical to the directional coupler 200 described above, except that the inductor 272 and the capacitor 274 (i.e., circuit 270) have been omitted from the MoCA bypass circuit 580. It has been found that this design may be sufficient to support MoCA signals in a stand-alone 2-way power divider network.

Figure 11B:
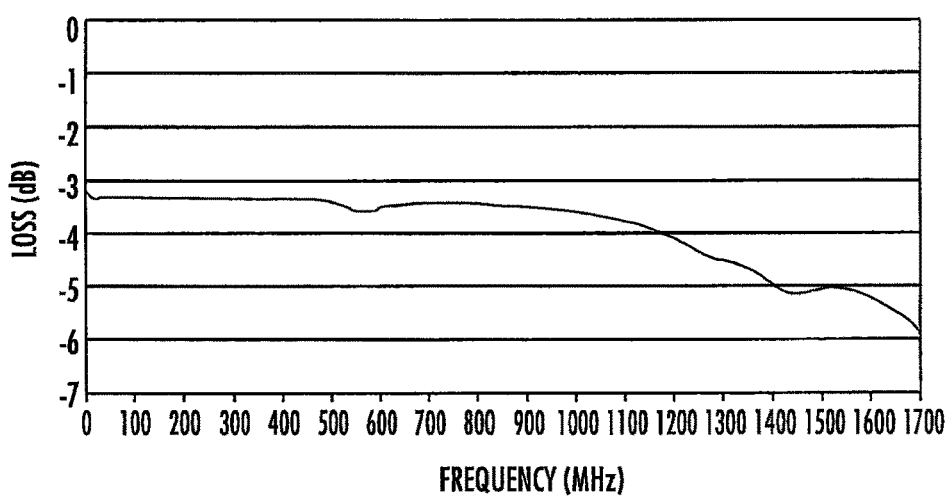
FIG. 11B is a graph illustrating the measured insertion loss of the RF directional coupler of FIG. 11A as a function of frequency.

FIG. 11B is a graph illustrating the measured insertion loss of the RF directional coupler of FIG. 11A as a function of frequency. As shown in FIG. 11B, the insertion loss performance is quite good, with an insertion loss of about 3.25 dB at frequencies under 500 MHz, and a maximum insertion loss in the CATV frequency band of only about 3.5 dB. The insertion loss increases in the MoCA frequency band to a maximum of about 5.75 dB at 1675 MHz.

Figure 12A:
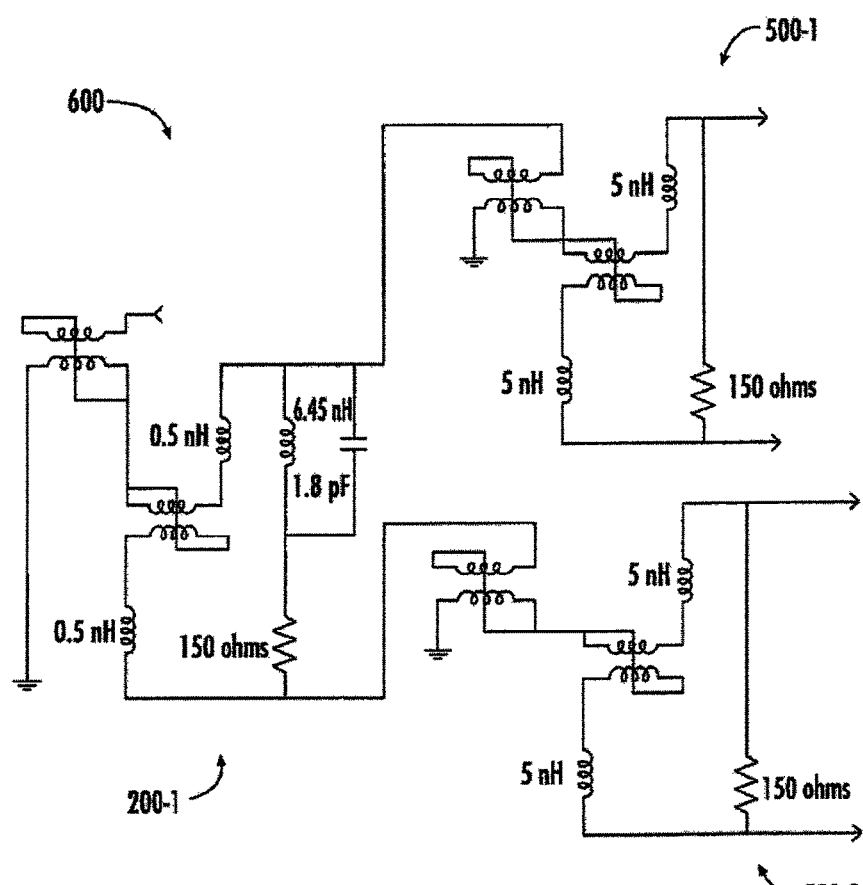
FIG. 12A is a circuit diagram of a 4-way power divider network that includes simplified MoCA bypass paths on selected directional couplers.

FIG. 12A is a circuit diagram of a 4-way power divider network 600 according to further embodiments of the present invention. As shown in FIG. 12A, the power divider network 600 includes a first directional coupler 200-1 at the first (base) level that has the design of directional coupler 200 (with the values of the circuit elements in MoCA bypass circuit 280 modified) and a pair of directional couplers 500-1, 500-2 at the second level of the power divider network 600 that have the design of directional coupler 500.

Figure 12B:
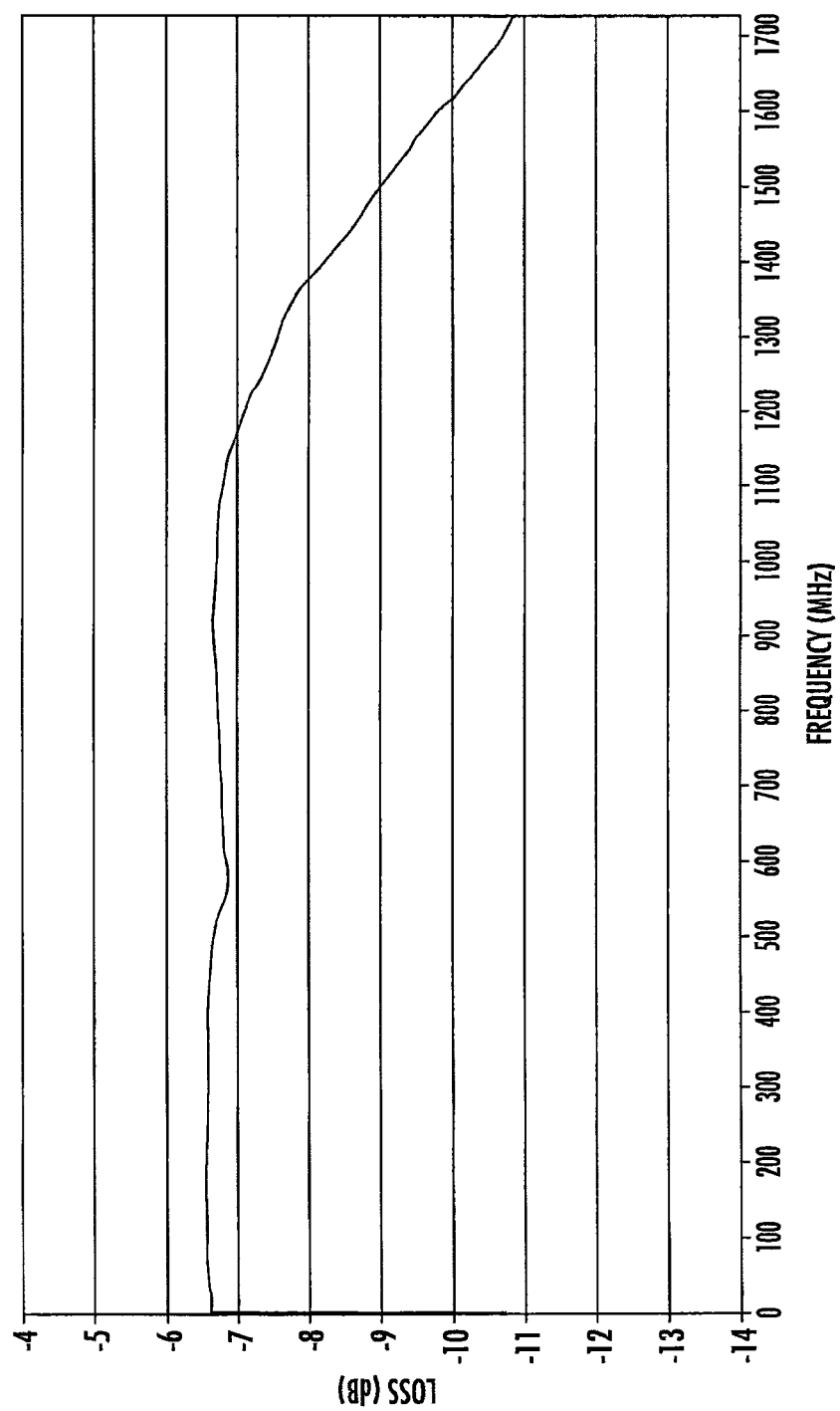
FIG. 12B is a graph illustrating the measured insertion loss of the 4-way power divider network of FIG. 12A as a function of frequency.

FIG. 12B is a graph illustrating the measured insertion loss of the 4-way power divider network 600 as a function of frequency. As shown in FIG. 12B, the insertion loss performance is less than 7 dB throughout the entire CATV frequency band, and drops off to about 10.5 dB at the highest frequencies in the MoCA frequency band.

Figure 13:
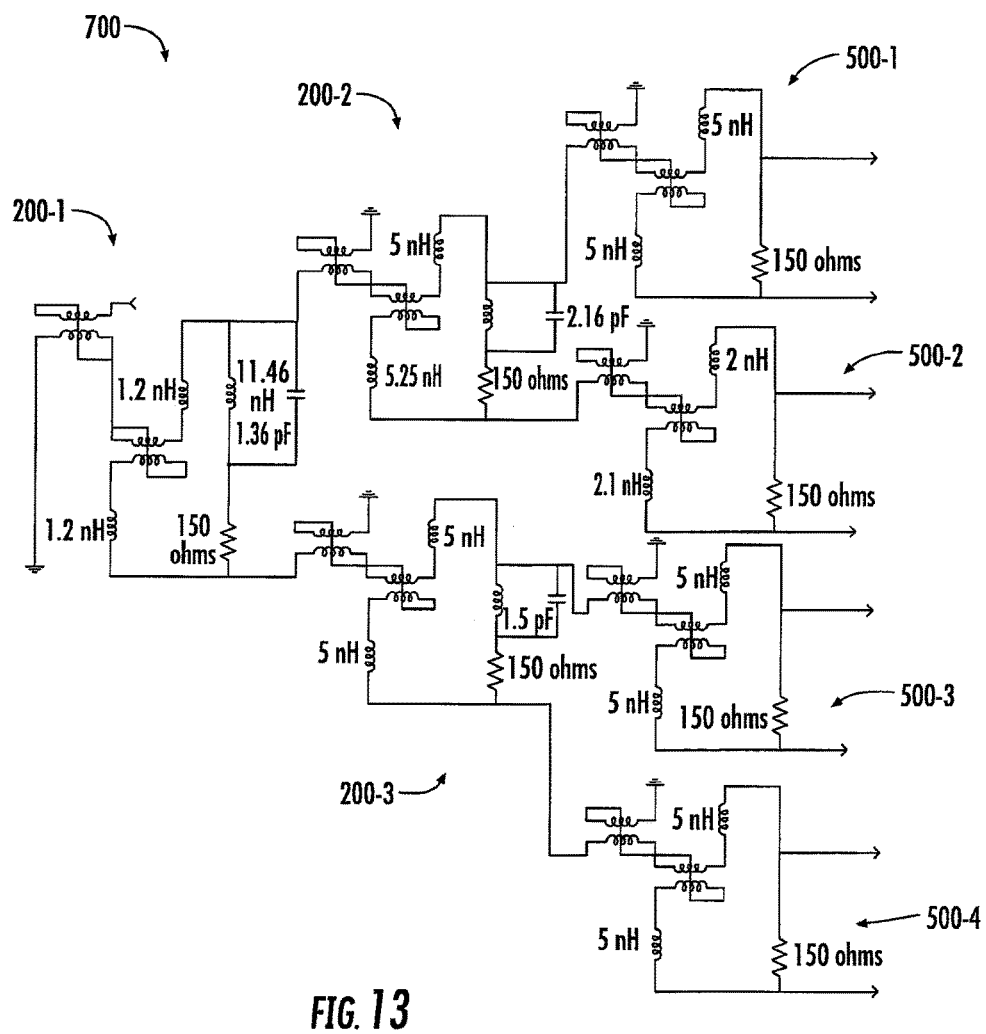
FIG. 13 is a circuit diagram of an 8-way power divider network that includes simplified MoCA bypass paths on selected directional couplers.

FIG. 13 is a circuit diagram of an 8-way power divider network 700 according to still further embodiments of the present invention. As shown in FIG. 13, the power divider network 700 includes three directional couplers 200-1, 200-2, 200-3 at the first and second levels that have the design of directional coupler 200 (with the values of the circuit elements in MoCA bypass circuit 280 modified) and four directional couplers 500-1 through 500-4 that have the design of directional coupler 500 of FIG. 11A at the third level of the power divider network 700.

When MoCA signals are transmitted between end devices that are coupled to the output ports of the same directional coupler of a multi-level power divider network the overall signal loss tends to be less than the case in which the end devices are coupled to output ports of different directional couplers since, in the first case, the MoCA signal must only pass through a single directional coupler. Accordingly, the higher or highest levels of power divider networks according to embodiments of the present invention may have simpler MoCA bypass circuits such as the MoCA bypass circuit 580 of FIG. 11A and still provide acceptable performance. These simpler MoCA bypass circuits may be cheaper to manufacture and may require little or no tuning. However, if the MoCA signal must traverse multiple levels of a power divider network, the overall signal losses may increase. Thus, more complex MoCA bypass circuits may be used in the lower levels of power divider networks according to embodiments of the present invention (i.e., the directional coupler on the right hand side of FIG. 13), and these MoCA bypass circuits may be designed and tuned to act akin to multi-pole filters to reduce the losses experienced by MoCA signals that traverse multiple levels of the power divider network.

Figure 14:
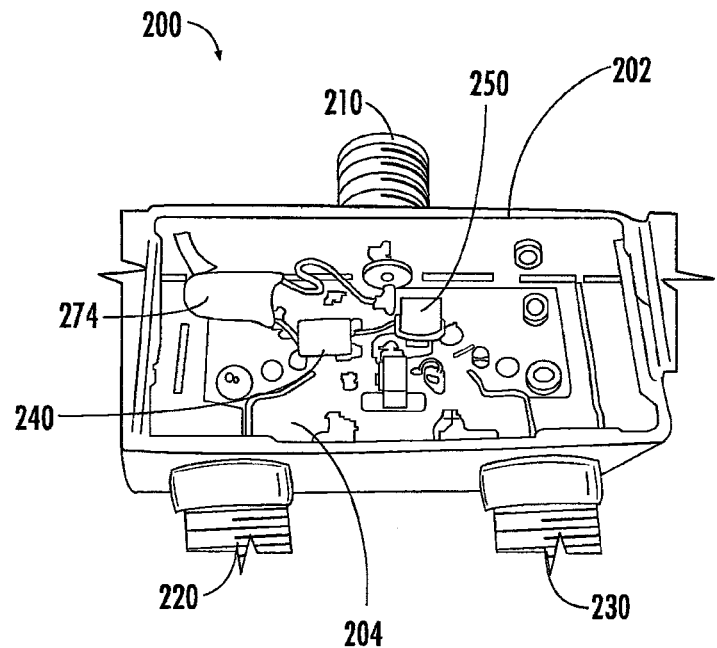
FIG. 14 is a perspective view of a power divider network according to embodiments of the present invention with the cover plate of the housing thereof removed.
Figure 15:
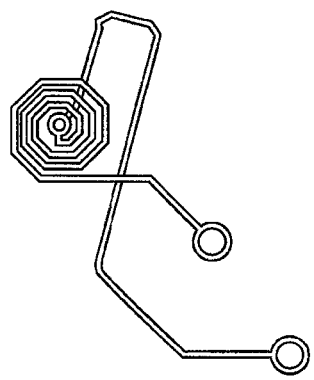
FIG. 15 is a schematic plan view of an inductor that is implemented as a conductive trace having self-coupling sections on a printed circuit board.

FIG. 14 is a perspective view of an implementation of the power divider network 200 of FIG. 11A with the cover plate of the housing thereof removed. As shown in FIG. 14, the input port 210 and the output ports 220, 230 may be implemented using conventional female coaxial connector ports. Each of these ports 210, 220, 230 is mounted on a wall of a housing 202, and includes a contact that is electrically connected to a printed circuit board 204 that is mounted within the housing 202. A plurality of circuit elements are surface mounted on the printed circuit board 204. These circuit elements include the first and second impedance transformers 240, 250, the resistor 260 and inductors 262, 264. The inductors 262, 264 are implemented as conductive trace segments on the printed circuit board 204 that are designed to have self-coupling sections. FIG. 15 shows another design for an inductor implemented on a printed circuit board. The inductors 262, 264 may alternatively be implemented as surface mount devices, air coils or using any other appropriate inductor implementations.

The power divider networks according to embodiments of the present invention may be sufficiently low loss in the MoCA frequency band such that it may not be necessary to include a low pass filter at the input to the power divider network. As discussed above, some MoCA power dividers include such a low pass filter that may be designed to reflect signals in the MoCA frequency band. This low pass filter may both protect the CATV network from the ingress of signal energy from the MoCA signals while also reflecting such signal energy back into the power divider network to reduce the loss experienced by MoCA signals in traversing the power divider network. The power divider networks according to embodiments of the present invention may also exhibit lower insertion loss values as compared to MoCA power dividers that use a reflective low pass filter as the MoCA signals may not need to travel through as much of the power divider network as the MoCA signals can pass between the output ports of the splitters in the power divider network.

As noted above, including additional circuit elements beyond resistor 260 on the path between the output ports 220, 230 of directional coupler 200 such as inductor 272 and capacitor 274 may degrade the impedance matching at the output ports 220, 230. In some embodiments of the present invention, only the resistor 260 may be provided in the circuit path between the output ports of the directional couplers that form the highest level of directional couplers in a power divider network. This may provide improved insertion loss performance.

The power divider networks according to embodiments of the present invention may be less expensive than conventional MoCA power divider networks as these may use fewer components in the MoCA bypass circuits and as they may not require a low pass filter or other MoCA rejection filter at the input to the power divider network. These power divider networks also be easier to tune.

The power divider networks according to embodiments of the present invention may also have a relatively smooth insertion loss performance curve (as a function of frequency). For example, in some embodiments, the insertion loss curve may continuously increase or decrease as a function of frequency. This is in contrast to prior art approaches which may have a sharp increase in insertion loss in a guard band between the CATV frequency band and the MoCA frequency band. While such insertion loss performance may be appealing theoretically as it may appear to provide enhanced insertion loss performance in both the CATV frequency band and the MoCA frequency band, tuning issues and/or changes in performance based on, for example, temperature, may cause the location of the sharp increase in insertion loss to vary in practice, which may result in poor performance if the increase falls into either the MoCA or CATV frequency bands.

While not shown in the figures, it will be appreciated that DC blocking capacitors may be provided in series on the output legs of the directional couplers at the highest level of the power divider networks. These DC blocking capacitors may be configured to block direct current signals from entering the power divider network through the output ports thereof. Additionally, in some embodiments, inductors may be coupled between the output ports of the directional couplers at the highest level of the power divider networks and ground that provide surge protection for the power divider network.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Well-known functions or constructions may not be described in detail for brevity and/or clarity. As used herein the expression "and/or" includes any and all combinations of one or more of the associated listed items.

It will be understood that when an element is referred to as being "coupled to" or "connected to" another element, it can be directly coupled or connected to the other element or intervening elements may also be present. In contrast, when an element is referred to as being "directly coupled to" or "directly connected to" another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A radio frequency ("RF") power divider network, comprising:
   a first directional coupler having a first RF input port, a first signal splitting circuit, first and second RF output ports and a first MoCA bypass circuit that is configured to pass signals in a MoCA frequency band between said first RF output port and said second RF output port;
   a second directional coupler having a second RF input port that is coupled to said first RF output port, a second signal splitting circuit, third and fourth RF output ports and a second MoCA bypass circuit that is configured to pass signals in the MoCA frequency band between said third RF output port and said fourth RF output port; and
   a third directional coupler having a third RF input port that is coupled to said second RF output port, a third signal splitting circuit, fifth and sixth RF output ports and a third MoCA bypass circuit that is configured to pass signals in the MoCA frequency band between said fifth RF output port and said sixth RF output port,
   wherein the first MoCA bypass circuit is different from said second MoCA bypass circuit and said third MoCA bypass circuit in that at least one component of said first MoCA bypass circuit is different in value compared to components of said second MoCA bypass circuit and said third MoCA bypass circuit.

2. The radio frequency ("RF") power divider network of claim 1, wherein said second MoCA bypass circuit includes a resistor having a first terminal connected to said third RF output port and a second terminal connected to said fourth RF output port.

3. The radio frequency ("RF") power divider network of claim 2, wherein said resistor has a value of 150 ohms.

4. The radio frequency ("RF") power divider network of claim 2, wherein said second terminal is directly connected to said fourth RF output port.

5. The radio frequency ("RF") power divider network of claim 2, wherein said second MoCA bypass circuit further includes an inductor having a first terminal and a second terminal, and wherein said second terminal of said inductor is connected to said first terminal of said resistor and said first terminal of said inductor is connected to said third RF output port.

6. The radio frequency ("RF") power divider network of claim 5, wherein said second terminal of said inductor is directly connected to said first terminal of said resistor.

7. The radio frequency ("RF") power divider network of claim 6, wherein said first terminal of said inductor is directly connected to said third RF output port.

8. The radio frequency ("RF") power divider network of claim 2, wherein said second MoCA bypass circuit further includes an inductor and a capacitor connected between said first terminal of said resistor and said third RF output port.

9. The radio frequency ("RF") power divider network of claim 8, wherein said resistor has a value of 150 ohms.

10. The radio frequency ("RF") power divider network of claim 1, wherein said second MoCA bypass circuit presents an inductance or capacitance value between said third RF output port and said fourth RF output port which is different from an inductance or capacitance value presented by said first MoCA bypass circuit between said first RF output port and said second RF output port.

11. The radio frequency ("RF") power divider network of claim 10, wherein said third MoCA bypass circuit presents an inductance or capacitance value between said fifth RF output port and said sixth RF output port which is different from an inductance or capacitance value presented by said first MoCA bypass circuit between said first RF output port and said second RF output port.

12. The radio frequency ("RF") power divider network of claim 11, wherein said second and third MoCA bypass circuits are configured the same.

13. A radio frequency ("RF") power divider network, comprising:
a first directional coupler having a first RF input port, a first signal splitting circuit, first and second RF output ports and a first MoCA bypass circuit that is configured to pass signals in a MoCA frequency band between said first RF output port and said second RF output port;
a second directional coupler having a second RF input port that is coupled to said first RF output port, a second signal splitting circuit, third and fourth RF output ports and a second MoCA bypass circuit that is configured to pass signals in the MoCA frequency band between said third RF output port and said fourth RF output port; and
a third directional coupler having a third RF input port that is coupled to said second RF output port, a third signal splitting circuit, fifth and sixth RF output ports and a third MoCA bypass circuit that is configured to pass signals in the MoCA frequency band between said fifth RF output port and said sixth RF output port,
wherein said first MoCA bypass circuit is different from said second MoCA bypass circuit in that at least one component of said first MoCA bypass circuit is different in value compared to components of said second MoCA bypass circuit, and wherein said first MoCA bypass circuit includes a capacitor in parallel with an inductor.

14. The radio frequency ("RF") power divider network of claim 13, wherein said second MoCA bypass circuit presents an inductance or capacitance value between said third RF output port and said fourth RF output port which is different from an inductance or capacitance value presented by said first MoCA bypass circuit between said first RF output port and said second RF output port.

15. The radio frequency ("RF") power divider network of claim 14, wherein said second and third MoCA bypass circuits are configured the same.

16. A radio frequency ("RF") power divider network, comprising:
a first directional coupler having a first RF input port, a first signal splitting circuit, first and second RF output ports and a first MoCA bypass circuit that is configured to pass signals in a MoCA frequency band between said first RF output port and said second RF output port;
a second directional coupler having a second RF input port that is coupled to said first RF output port, a second signal splitting circuit, third and fourth RF output ports and a second MoCA bypass circuit that is configured to pass signals in the MoCA frequency band between said third RF output port and said fourth RF output port;
a third directional coupler having a third RF input port that is coupled to said second RF output port, a third signal splitting circuit, fifth and sixth RF output ports and a third MoCA bypass circuit that is configured to pass signals in the MoCA frequency band between said fifth RF output port and said sixth RF output port;
a fourth directional coupler having a fourth RF input port that is coupled to said third RF output port, a fourth signal splitting circuit, seventh and eighth RF output ports and a fourth MoCA bypass circuit that is configured to pass signals in the MoCA frequency band between said seventh RF output port and said eighth RF output port;
a fifth directional coupler having a fifth RF input port that is coupled to said fourth RF output port, a fifth signal splitting circuit, ninth and tenth RF output ports and a fifth MoCA bypass circuit that is configured to pass signals in the MoCA frequency band between said ninth RF output port and said tenth RF output port;
a sixth directional coupler having a sixth RF input port that is coupled to said fifth RF output port, a sixth signal splitting circuit, eleventh and twelfth RF output ports and a sixth MoCA bypass circuit that is configured to pass signals in the MoCA frequency band between said eleventh RF output port and said twelfth RF output port; and
a seventh directional coupler having a seventh RF input port that is coupled to said sixth RF output port, a seventh signal splitting circuit, thirteenth and fourteenth RF output ports and a seventh MoCA bypass circuit that is configured to pass signals in the MoCA frequency band between said thirteenth RF output port and said fourteenth RF output port,
wherein said second MoCA bypass circuit is different from said fourth MoCA bypass circuit in that at least one component of said second MoCA bypass circuit is different in value compared to components of said fourth MoCA bypass circuit.

17. The radio frequency ("RF") power divider network of claim 16, wherein said first MoCA bypass circuit is different from said second MoCA bypass circuit and said fourth MoCA bypass circuit in that at least one component of said first MoCA bypass circuit is different in value compared to components of said second MoCA bypass circuit and said fourth MoCA bypass circuit.

18. The radio frequency ("RF") power divider network of claim 17, wherein said first, second and fourth MoCA bypass circuits each include a resistor, and wherein said resistor of said fourth MoCA bypass circuit is 150 ohms.

19. The radio frequency ("RF") power divider network of claim 17, wherein said first, second and third MoCA bypass circuits, each include an inductor in parallel with a capacitor.

20. The radio frequency ("RF") power divider network of claim 19, wherein said fourth, fifth, sixth and seventh MoCA bypass circuits are configured the same.

* * * * *